United States Patent [19]

Manocha et al.

[11] Patent Number: 5,141,897
[45] Date of Patent: Aug. 25, 1992

[54] METHOD OF MAKING INTEGRATED CIRCUIT INTERCONNECTION

[75] Inventors: Ajit S. Manocha, Allentown; Virendra V. S. Rana, South Whitehall Township, Lehigh County, both of Pa.

[73] Assignee: AT&T Bell Laboratories, Murray Hill, N.J.

[21] Appl. No.: 701,569

[22] Filed: May 14, 1991

Related U.S. Application Data

[63] Continuation of Ser. No. 498,292, Mar. 23, 1990, abandoned.

[51] Int. Cl.$^5$ .................................... H01L 21/465
[52] U.S. Cl. ........................ 437/228; 437/190; 437/192; 437/197; 437/198; 437/194; 437/245; 437/246
[58] Field of Search ............... 437/190, 192, 195, 198, 437/194, 197, 295, 246

[56] References Cited

U.S. PATENT DOCUMENTS

| | | | |
|---|---|---|---|
| 3,856,648 | 12/1974 | Fuller et al. | 204/192.15 |
| 4,267,012 | 5/1981 | Pierce et al. | 437/192 |
| 4,566,026 | 1/1986 | Lee et al. | 357/65 |
| 4,624,864 | 11/1986 | Hartmann | 437/193 |
| 4,710,398 | 12/1987 | Homma et al. | 437/245 |
| 4,742,014 | 5/1988 | Hooper et al. | 437/192 |
| 4,764,484 | 8/1988 | Mo | 437/192 |
| 4,851,369 | 7/1989 | Ellwanger et al. | 437/192 |
| 4,866,008 | 9/1989 | Brighton et al. | 437/230 |
| 4,884,123 | 11/1989 | Dixit et al. | 437/190 |
| 4,910,169 | 3/1990 | Hoshino | 437/230 |
| 4,954,423 | 9/1990 | McMann et al. | 437/190 |

FOREIGN PATENT DOCUMENTS

| | | | |
|---|---|---|---|
| 0143652 | 7/1985 | European Pat. Off. | 437/192 |
| 0050429 | 3/1982 | Japan | 437/192 |
| 0169151 | 9/1984 | Japan | 437/195 |
| 0085513 | 5/1985 | Japan | 437/194 |
| 0208850 | 9/1986 | Japan | 437/192 |

OTHER PUBLICATIONS

"Submicron Wiring Technology with Tungsten and Planarization," C. Kaanta et al., Proceedings of the Fifth International IEEE VLSI Multilevel Interconnection Conference (VMIC), Santa Clara, CA, Jun. 13–14, 1988, pp. 21–28.

Sachdev et al.; "Tungsten interconnects in VLSI"; Proceedings of the 1985 Workshop; MRS; Oct., 1985; pp. 161–171.

"Interconnect Materials for VLSI Circuits"; Paulean; Solid State Tech. Apr., 1987; pp. 155–162.

"Nucleation and Growth . . . A Review"; Broadbent; J. Vac. Sci. Tech. B. vol. 5 (6); Nov.;Dec. 1987; pp. 1661–1666.

"High–density . . . Groove Metallization"; Broadbent et al; IEEE Transactions on Electron Devices; vol. 35, No. 7, Jul. 88; pp. 952–956.

Primary Examiner—Brian E. Hearn
Assistant Examiner—Trung Dang
Attorney, Agent, or Firm—John T. Rehberg

[57] ABSTRACT

An integrated circuit and method of fabrication are disclosed. The invention provides an etch-stop layer between a plug formed in a via and an overlying runner. The etch stop layer serves a variety of functions, including protecting the plug during the etching process which defines the runner.

4 Claims, 4 Drawing Sheets

METHOD OF MAKING INTEGRATED CIRCUIT INTERCONNECTION

This application is a continuation of application Ser. No. 07/498,292, filed on Mar. 23, 1990 now abandoned.

TECHNICAL FIELD

This invention relates generally to semiconductor integrated circuits and to methods for fabricating them.

BACKGROUND OF THE INVENTION

As integrated circuits become increasingly smaller and more complex, it has become necessary to create multiple layers of conductive interconnections between transistors. These conductive interconnections are often, although not necessarily, made from metal and are termed "runners."

In a typical Field Effect Transistor (FET) integrated circuit fabrication process, the source, drain and gate are formed first. Then a layer of dielectric material is formed to cover the source, drain and gate. The dielectric is subsequently patterned to create openings, often termed "windows" or "vias" over transistor regions (such as the source, drain or gate) to which an electrical contact is desired. For convenience and simplicity, dielectric openings will be termed "vias" in the following paragraphs. In typical subsequent processing, a conductive material may be deposited both in the vias and as a blanket layer upon the dielectric.

In certain integrated circuit designs, the vias may be filled utilizing the same process which forms the blanket metallic layer. In other designs, a conductive plug may be formed within the via and then the overlying blanket metallic layer may be formed in a separate step. In certain designs, the plug may be made of a different material from the overlying blanket metallic layer. In other designs, the plug and the overlying metallic layer may be made of the same material. After the blanket metallic layer has been formed, the blanket layer is patterned to form runners which may connect individual transistors.

When the plug and the overlying blanket layer are formed from the same material, various problems may arise during subsequent processing. For example, there is a danger that a misalignment of the runner mask will permit the runner etching process to expose a portion of the upper surface of the plug and etch the plug (at least in the vicinity of the via wall), thereby damaging it.

One solution to the misalignment problem is to employ "nailheads." Nailheads are portions of increased width within a runner. Nailheads are dimensioned and positioned within the runner to completely cover a plug even if a mask misalignment should occur. Thus, if the protective nailhead is properly positioned, a slight misalignment of the runner mask will not pose any danger to the underlying plug because the plug will remain covered by the nailhead during the runner etching process. However, one disadvantage to the use of nailheads is that they consume extra space in the circuit layout. As integrated circuit geometries shrink, designers have consistently sought ways to reduce space consumption.

In more complex integrated circuits, additional layers of conductive interconnection may be fabricated by a repetition of the process described above. For example, a second layer of dielectric material may be formed which covers both the previously formed runners and the first dielectric layer upon which those runners are formed. Then vias may be opened in the second dielectric layer. The vias may be filled with conductive material and an overlying blanket metallic layer may then be patterned to form a higher level runner. The higher level runners electrically connect the lower level runners through the vias.

The next few paragraphs discuss some of the more commonly used interconnection materials. Sputtered aluminum is a commonly used material for forming conductive interconnections. However, the use of aluminum presents certain problems to the integrated circuit designer. Sputtered aluminum generally exhibits poor step coverage in vias and does not fill them adequately. Special procedures or techniques must often be employed to create aluminum plugs which will adequately fill vias. Furthermore, aluminum does not tolerate high temperature processing very well. Consequently, after aluminum runners have been formed, subsequent thermal processing of the integrated circuit must be restricted to low temperatures.

Tungsten has become an increasingly popular material for integrated circuit fabrication. Tungsten plugs may be formed within high aspect ratio vias by techniques known to those skilled in the art. Often a tungsten plug is formed by etching back a blanket tungsten layer. A disadvantage is that the blanket tungsten, which fills the vias somewhat conformally, often exhibits a central seam in the via and/or a dimple on top of the via. The seam is particularly vulnerable to the etching process used to form the plugs. Thus, the process of forming the plugs from blanket tungsten may destroy or at least impair the tungsten material within the via. The tungsten plug is frequently contacted by an overlying aluminum blanket layer. The aluminum layer is subsequently patterned to form runners. However, as mentioned before, the presence of the aluminum runners means that subsequent thermal processing must be restricted to lower temperatures. Another disadvantage is that aluminum and tungsten may react to form an intermetallic compound.

Integrated circuits designers have given increasing attention to the use of tungsten as an interconnection material, i.e., as a runner. The conductive tungsten runners are comparatively impervious to subsequent routine high temperature processing. For example, after vias are defined, a blanket layer of tungsten is deposited, which both fills the vias and covers the dielectric. Then the tungsten is patterned to form runners. However, the use of blanket tungsten to both fill vias and form runners may have disadvantages. One disadvantage of the blanket tungsten approach is that adhesion between the tungsten and underlying dielectric is often poor. Also, the process for etching tungsten to form runners can result in an etch down the plugs if the photoresist is misaligned.

SUMMARY OF THE INVENTION

In an illustrative embodiment of the present invention, a patterned dielectric is formed having at least one opening. The opening is at least partially filled with a first material. Then a second material layer is formed in contact with the first material layer and with the dielectric layer. A third material layer is formed on top of the second material layer. Then the third material layer is patterned by a process which includes etching while the second material layer serves as an etch stop. Next the second material layer is patterned.

Illustratively, the first and third material layers may include such materials as aluminum, tungsten, nickel, copper and mixtures or alloys rich in these metals. The second material layer may include tungsten silicide, titanium nitride, or titanium-tungsten.

DETAILED DESCRIPTION

Figure 1:
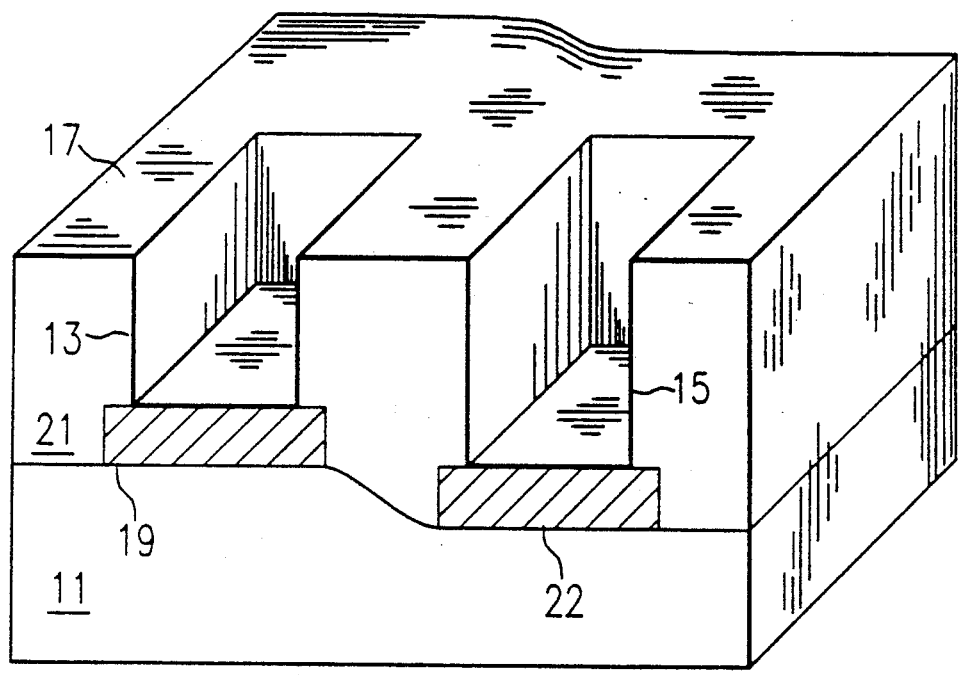
FIGS. 1-8 are partially perspective, partially cross-sectional views illustrating the method of fabricating an illustrative embodiment of the present invention.

The present invention may perhaps be most easily understood if the fabrication process employed in an illustrative embodiment is outlined. Turning to FIG. 1, reference numeral 11 denotes a material body which may include silicon, doped silicon, epitaxial silicon, silicon dioxide, various nitrides, etc.—the exact composition of body 11 is not critical. Regions 19 and 22 are conductive. For example, 19 may be the upper portion of an FET gate. Region 22 may denote a source or drain of an FET. Alternatively, regions 19 and 22 may be conductive lower-level runners (typically made from metal). Or, regions 19 and 22 may be local interconnections formed from polysilicon or silicide or salicide. Alternatively, regions 19 or 22 may be contacts to a bipolar transistor. Whatever regions 19 or 22 denote, it is desired to form an electrical connection to both regions and to have the subsequently formed electrical connection separated from regions 19 and 22 by dielectric material.

Accordingly, reference numeral 21 designates a dielectric layer covering conductive regions 19 and 22. For example, reference numeral 21 may denote silicon dioxide from a silane-based reaction or from other precursor material. Some examples of suitable precursors are tetraethoxysilane ($Si(OC_2H_5)_4$) with the acronym "TEOS," tetramethoxysilane ($Si(OCH)_4$) with the acronym "TMOS," diacetoxyditertiarybutoxysilane ($C_{10}H_{26}O_4Si$) with the acronym "DADBS," and tetramethylcyclotetrasiloxane ($C_4H_{16}Si_4O_4$) with the acronym "TMCTS" sold under the trademark "TOMCATS" by J. C. Schumacher, a unit of Air Products and Chemicals, Inc. Dielectric 21 may be formed by plasma enhanced chemical vapor deposition if desired. It will be noted that upper surface 17 of dielectric 21 is depicted in FIG. 1 as being relatively flat (i.e., at least locally planarized). Such planarization is not necessary to the practice of the present invention—it merely makes the figure simpler. Openings 13 and 15 have been created in dielectric 21 by techniques known to those skilled in the art, e.g., by plasma etching. Opening 13 is above conductive region 19, while opening 15 is above conductive region 22. Openings 13 and 15 are illustrated with square or rectangular cross-sections (in the plane of surface 17). However, practical present-day lithography frequently produces openings with somewhat circular cross-sections, i.e., openings having somewhat circular cylindrical shapes. The precise shape of openings 13 and 15 is unimportant for the practice of the present invention. It will be noted that opening 15 is illustrated somewhat deeper than opening 13. The present invention may be employed whether or not all of the openings have the same depth.

Figure 2:
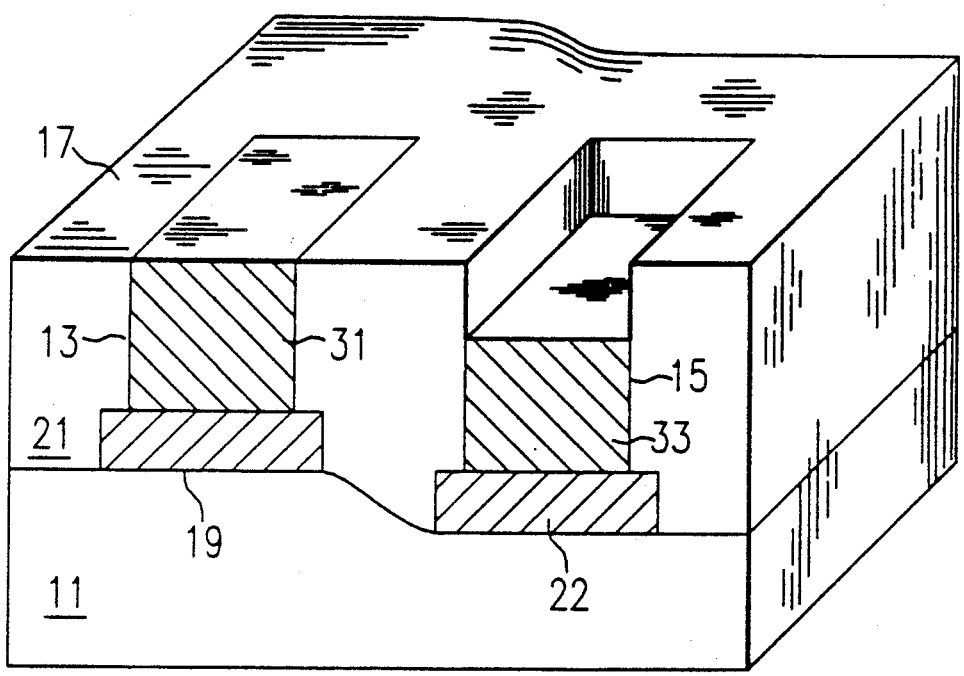

Turning now to FIG. 2, openings 13 and 15 have been filled with conductive material 31 and 33, respectively. It will be noted that opening 13 is completely filled, whereas opening 15 is only partially filled. Some material formation processes may completely fill all of the openings within a dielectric, whereas other deposition processes may not completely fill all of the openings. The present invention is applicable to both situations. As mentioned before, the conductive material 31 and 33 within openings 13 and 15, respectively, is frequently termed a "plug." For example, as mentioned before, plugs 31 and 33 may be formed by the selective deposition of tungsten. ("Selective tungsten" is a term used to describe tungsten which deposits on silicon, metals or silicide and not on silicon dioxide.) A variety of processes for forming selective tungsten are known to those skilled in the art. Typically these processes involve reduction of tungsten hexafluoride by hydrogen or silane under process conditions that favor selectivity. Thus, the selective tungsten process produces a tungsten plug inside the via and does not (generally) produce any significant accumulation of tungsten on the upper surface of the dielectric. Furthermore, the selective tungsten process, which tends to fill the opening from the bottom upwards, does not generally exhibit a central seam. Other suitable plug materials are, for example, aluminum, copper, nickel, aluminum-rich mixtures, aluminum-rich alloys, copper-rich mixtures and copper-rich alloys.

Figure 3:
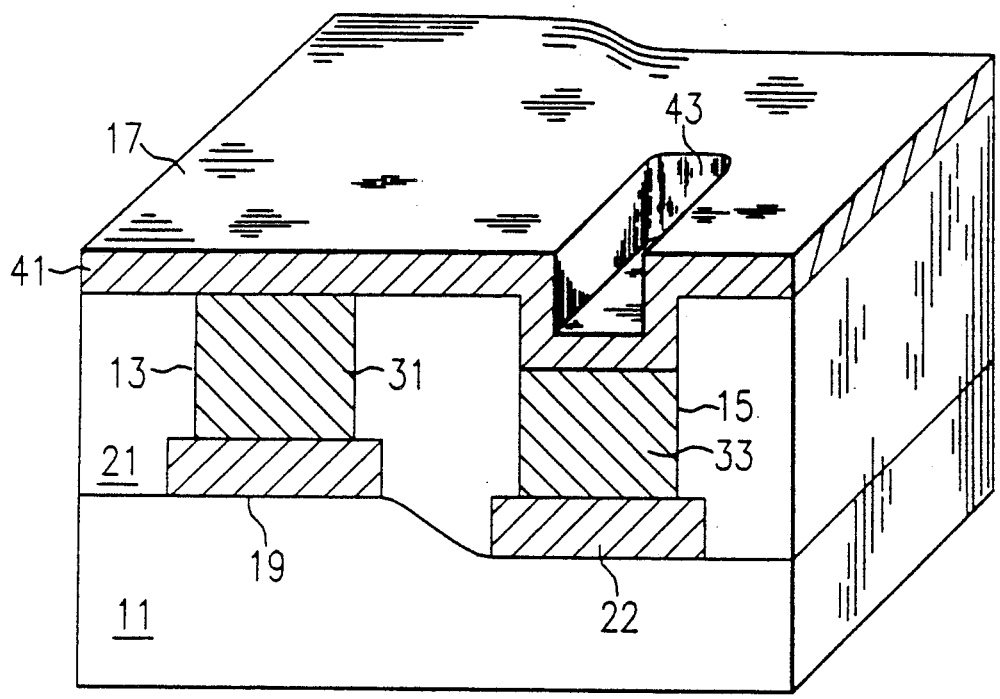

FIG. 3 illustrates the formation of layer 41 after plugs 31 and 33 have been formed. Material layer 41 should be a material which serves as an effective etch stop against the etching procedures used to define the subsequently formed runners. For example, if the to-be-formed runners are tungsten, material layer 41 may be titanium nitride or titanium tungsten. However, if in situ processing is desired, layer 41 may be tungsten silicide ($WSi_2$). Should the to-be-formed runners be aluminum, layer 41 may be titanium nitride, titanium tungsten or tungsten silicide. If the to-be-formed runners are copper, material layer 41 may be titanium nitride or titanium tungsten. Layer 41 may exhibit a dimple or depression 43 over vias such as 15 which are not completely filled.

Figure 4:
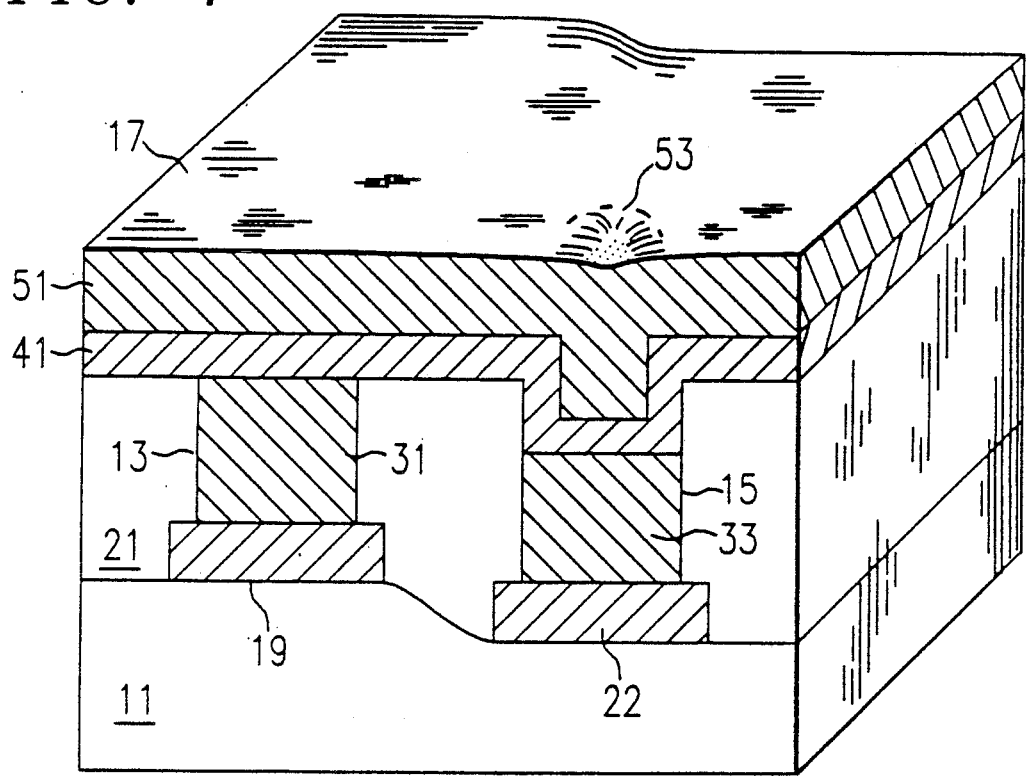

Turning to FIG. 4, conductive layer 51 is formed over layer 41. Layer 51 may be, for example, a layer of blanket tungsten. Blanket tungsten may be formed by reducing tungsten hexafluoride with hydrogen or silane. Other source gases such as tungsten hexachloride may also be used. Other refractory metals besides tungsten may be used; these metals may often be formed by hydrogen reduction from their respective chlorides. Alternatively, layer 51 may be aluminum or copper, or an aluminum-rich mixture, an aluminum-rich alloy, or a copper-rich mixture or a copper-rich alloy. A slight depression 53 may or may not be observed in layer 51 in the region where it completes the filling of opening 15. The presence or absence of a depression or seam 53 is not critical to the successful practice of the present invention.

Figure 5:
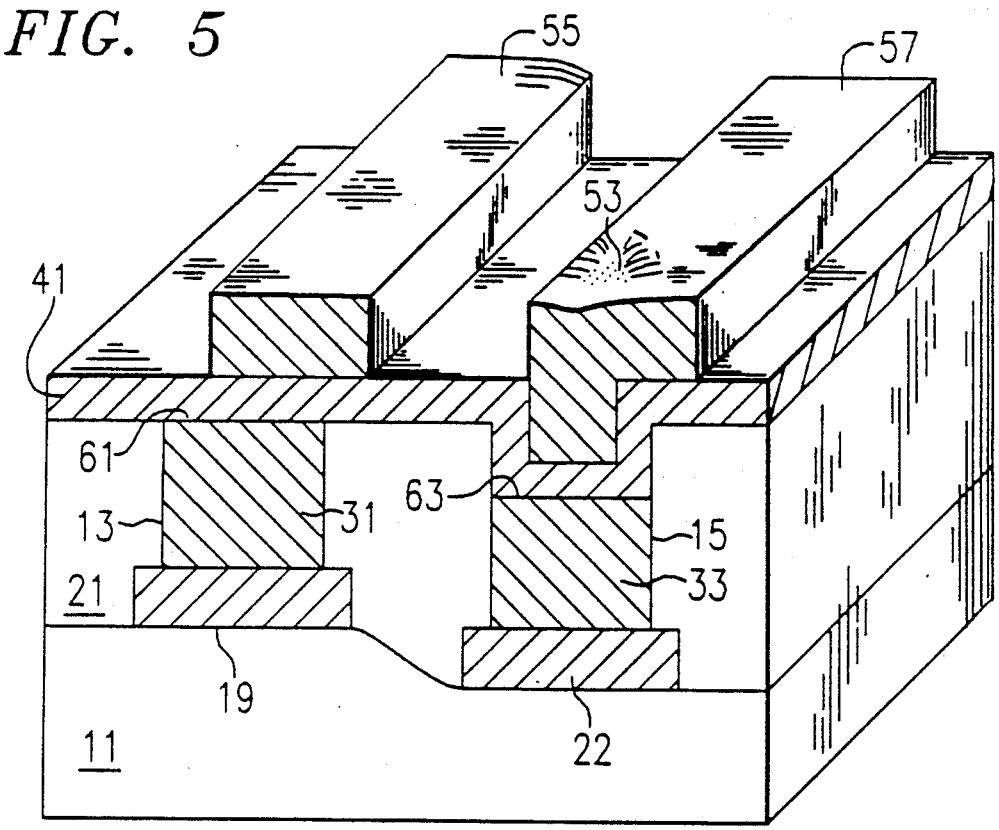

In FIG. 5, layer 51 is patterned by techniques known to those skilled in the art. For example, if layer 51 is tungsten, it may be patterned by reactive ion etching using $CF_4$ or $SF_6$. The etch procedure used to pattern layer 51 creates runners 55 and 57. Whatever etch procedure is employed, it should exhibit selectivity against layer 41, i.e., layer 41 should serve as an etch stop. It will be noted from an examination of FIG. 5, that runners 55 and 57 are slightly offset from plugs 31 and 33. Such offsets are a common result of misalignments during mass production techniques. Were layer 41 not present to serve as an etch stop, the etching procedure used to define runners 55 and 57 might etch downward into the otherwise exposed regions of plugs 31 and 33, denoted roughly by reference numerals 61 and 63, respectively. However, the presence of protective layer 41 preserves the integrity of plugs 31 and 33.

Figure 6:
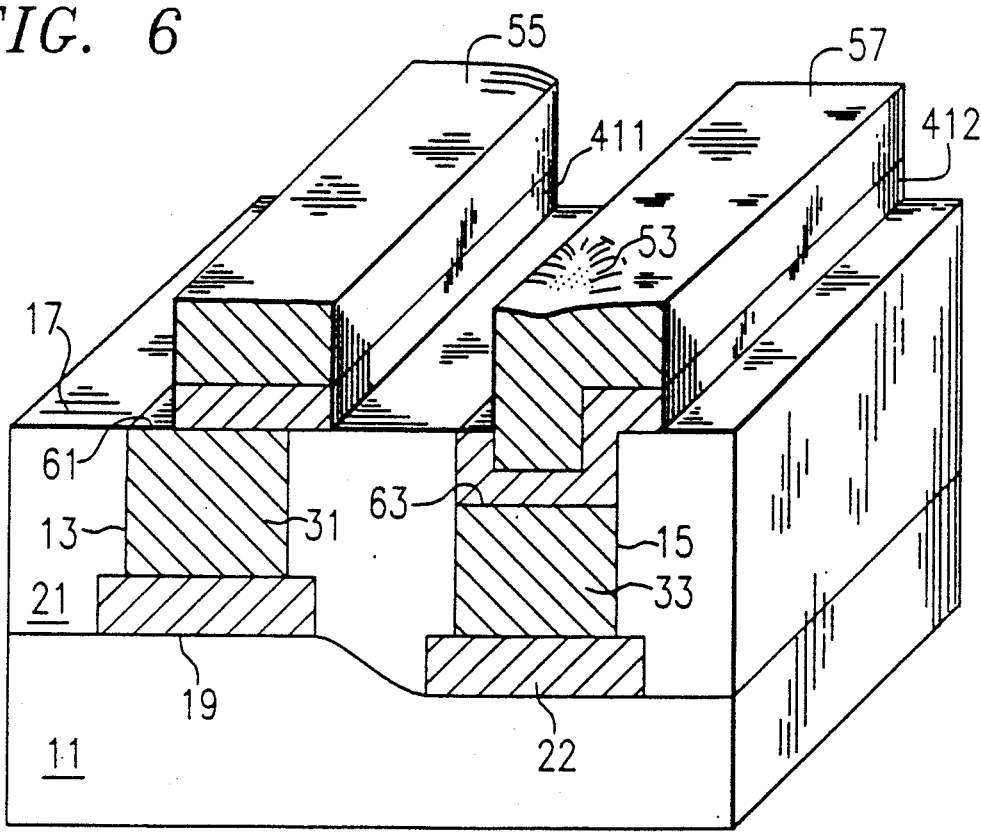

Turning to FIG. 6, it will be noted that layer 41 has been patterned using runners 55 and 57 essentially as masks. Layers 411 and 412 beneath runners 55 and 57 are created by the etching of layer 41. For example, if layer 41 is tungsten silicide, it may be patterned by $CF_4$, $SF_6$ mixed with chlorine or chlorofluorohydrocarbons. The etching procedure employed to etch layer 41 should exhibit good selectivity against plug material 31 and 33. The lesser the selectivity, the greater the care needed to etch layer 41. Since, for example, upper surface 61 of plug 31 is exposed by the etching of layer 41, it is, of course, necessary that layer 41 be conductive so that electrical conduction may take place between plug 31 and runner 55 and between plug 33 and runner 57. Thus, it will be noted that layer 41 has prevented intrusion of the runner-defining etch process into plugs 31 and 33, while ultimately, facilitating electrical conduction between these plugs and their respective associated runners.

The presence of layer 41 can present additional advantages when material layer 51 and plugs 31 and 33 are of dissimilar materials. For example, if layer 51 were aluminum, (and hence, runners 55 and 57) and plugs 31 and 33 tungsten, the use of titanium nitride for layer 41 will inhibit the formation of intermetallic tungsten-aluminum compounds.

Figure 7:
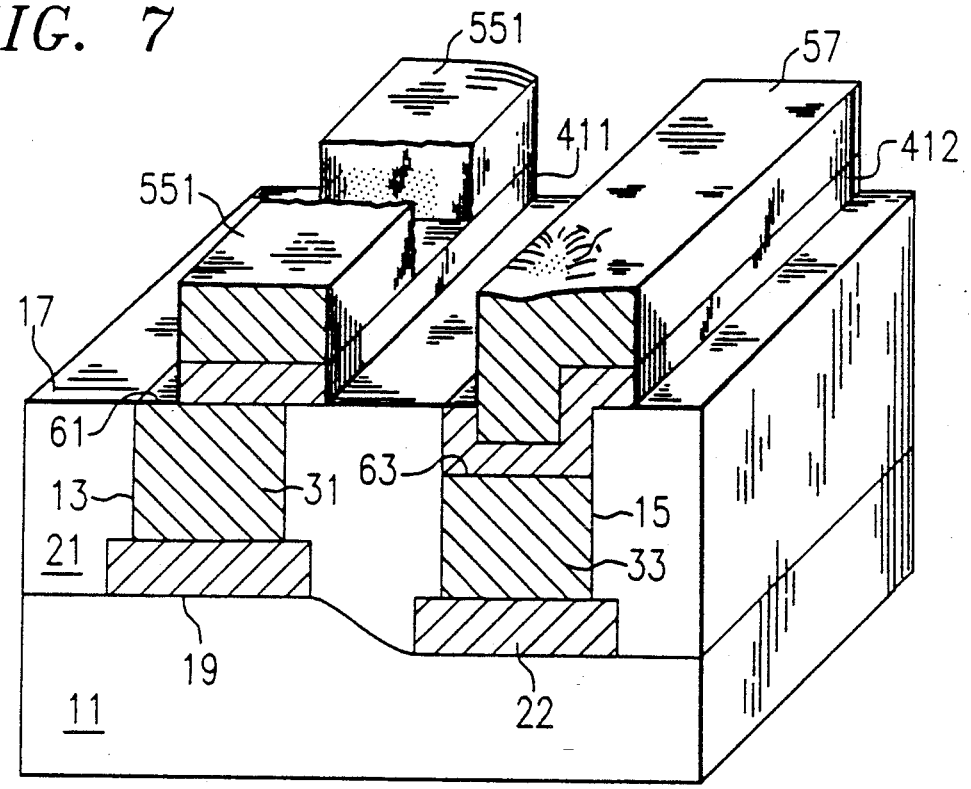

An additional advantage of the present invention is depicted in FIG. 7. Should runner 55 be broken, by perhaps electromigration or other failure, into two or more portions, designated in FIG. 7 by reference numerals 552 and 551, ordinarily electrical conduction would cease. However, the presence of underlying layer 411 may still serve to preserve conduction. An additional advantage of the present invention is that it tends to reduce the size of (or completely eliminate) depressions such as 53 because the openings such as 15 are filled from the bottom when selective tungsten processes are used first. (Such depressions may be more severe if a blanket tungsten process is used throughout.) Consequently, stacked vias are more easily designed with the present process.

Figure 8:
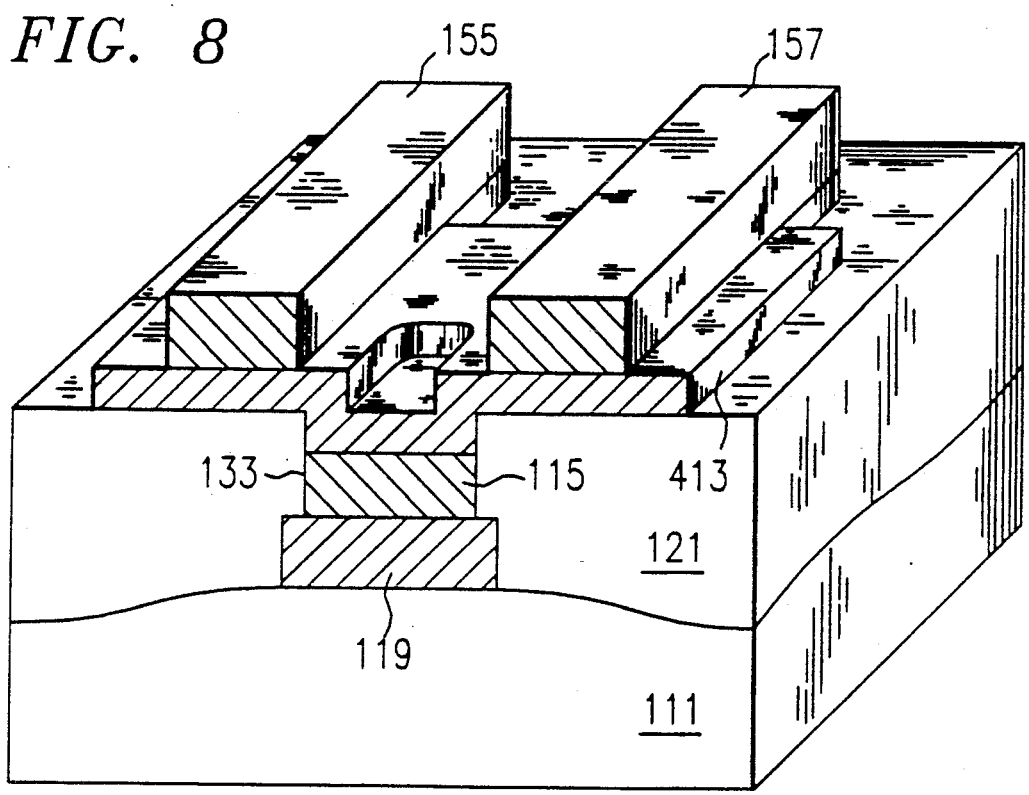

An additional embodiment of the present invention is illustrated in FIG. 8. Reference numeral 111 represents a substrate which may be any suitable material. Dielectric 121 overlies substrate 111 and surrounds conductive portion 119 which may be, for example, a source, a gate, a drain, a runner, a local interconnection, etc. Opening 133 has been made in dielectric 121 and partially filled with conductive material (plug) 115. (Optionally, opening 133 may be completely filled just as opening 13 is completely filled by plug 31 in FIGS. 3-7). Conductive layer 413 covers plug 115. Runners 155 and 157 both contact layer 413 and, thus, also electrically contact portion 119 through plug 115. Thus, the design illustrated in FIG. 8 permits the effective connection of two runners 155 and 157 together through the same via 133 to an underlying portion 119. Patterned material layer 413 thus serves as a local interconnection.

Fabrication of the structure shown in FIG. 8 is accomplished by first forming a blanket layer of material 413 and an overlying conductive material (similar to FIG. 4). Then the overlying conductive material is patterned to create runners 155 and 157, with the underlying layer serving as an etch stop (similar to FIG. 5). Then the underlying layer is patterned using a separate mask which defines layer 413 so that it connects both runners 155 and 157 with plug 115. The resulting structure may be contrasted with the structure of FIGS. 5 and 6 in which runners 55 and 57 effectively serve as masks for the patterning of underlying layer 41.

The present invention is applicable to bipolar technology and to integrated circuits using substrates other than silicon, such as III-V compounds.

We claim:

1. A method of integrated circuit fabrication comprising the steps of:
    forming a dielectric layer having at least one opening;
    at least partially filling said opening with a first material;
    forming a second material layer in contact with said first material layer and with said dielectric layer;
    forming a third material layer on top of said second material layer;
    patterning, by a process which includes etching, said third material layer to form at least two runners, said second material layer serving as an etch stop;
    patterning said second material layer to form a patterned layer which connects said runners.

2. The method of claim 1 in which said first material is chosen from the group consisting of tungsten, aluminum, aluminum-rich mixtures, aluminum-rich alloys, copper, copper-rich mixtures, and copper-rich alloys.

3. The method of claim 1 in which said second material is chosen from the group consisting of tungsten silicide, titanium tungsten and titanium nitride.

4. The method of claim 1 in which said third material is chosen from the group consisting of tungsten, tungsten-rich mixtures, tungsten-rich alloys, aluminum, aluminum-rich mixtures, aluminum-rich alloys, copper, copper-rich mixtures, and copper-rich alloys.

* * * * *